(12) United States Patent
Marcotte et al.

(10) Patent No.: US 7,031,171 B2
(45) Date of Patent: Apr. 18, 2006

(54) REAR CONNECTOR PANELS FOR HOUSINGS

(75) Inventors: Sylvain Marcotte, Pierrefonds (CA); Hugues Ricard, Ste-Rose (CA); Daniel Rochette, Mascouche (CA); Frédéric Rouette, Pierrefonds (CA)

(73) Assignee: Miranda Technologies Inc., Saint-Laurent (CA)

( * ) Notice: Subject to any disclaimer, the term of this patent is extended or adjusted under 35 U.S.C. 154(b) by 0 days.

(21) Appl. No.: 10/025,860

(22) Filed: Dec. 26, 2001

(65) Prior Publication Data

US 2003/0117768 A1   Jun. 26, 2003

(51) Int. Cl.
 *H02B 1/01* (2006.01)
(52) U.S. Cl. ............ 361/825; 361/818; 361/800; 439/607; 174/35 R; 174/51
(58) Field of Classification Search ........... 361/825, 361/752, 797, 728, 800, 796, 816, 714, 788, 361/789, 810, 818, 760, 730, 748, 741; 174/35, 174/51 R, 50.52, 250, 253, 255, 51, 35 R; 257/99; 438/836; 439/607
See application file for complete search history.

(56) References Cited

U.S. PATENT DOCUMENTS

| 4,179,172 A * | 12/1979 | Godsey et al. ............... 439/61 |
| 5,546,282 A * | 8/1996 | Hill et al. ..................... 361/796 |
| 5,943,219 A * | 8/1999 | Bellino et al. ............... 361/816 |
| 6,028,769 A * | 2/2000 | Zurek ........................... 361/704 |
| 6,196,876 B1 * | 3/2001 | Paagman ..................... 439/607 |
| 6,229,709 B1 * | 5/2001 | Hardt et al. ................. 361/753 |
| 6,496,376 B1 * | 12/2002 | Plunkett et al. ............. 361/729 |

OTHER PUBLICATIONS

Miranda Technologies Inc., product name 4 RU Housing Frame, as described on Miranda Technologies website http://www.miranda.com/en/products/Imaging/Symphonie.htm.
Leitch Technology International Inc., product name 3611 VI-C Component Video Input (YUV, RGBS to 4:2:2), as described on Leitch website http://www2.leitch.com/. Enter "3611VI-C" in *SEARCH* box, then click on *3611VI-C*.
Axon Digital Design, product name Synapse Rack Controller Card RRC 10, as described on Axon website http://www.axon.nl/. Click on *Products Synapse*, then click on *Rack Controller*.

* cited by examiner

*Primary Examiner*—Kamand Cuneo
*Assistant Examiner*—Hung S. Bui
(74) *Attorney, Agent, or Firm*—Ogilvy Renault LLP

(57) ABSTRACT

A housing adapted for receiving electronic cards therein, the housing comprising a chassis shielded from electromagnetic interference and having an opening in a face thereof. The chassis is adapted for receiving electronic cards therein. The chassis comprises a conductive cast shell Connector panels each have a printed circuit board body with a conductive plane, a card connector adapted for being connected to an electronic card in the housing, and input/output connectors. Each input/output connector is connected to the card connector by a printed circuit of the printed circuit board body. Each input/output connector is adapted for being connected to an input/output of a peripheral device. The connector panels are adapted for being mounted side by side and in shielding connection to cover the opening of the chassis so as to maintain an electromagnetic interference shielding of the housing.

27 Claims, 6 Drawing Sheets

REAR CONNECTOR PANELS FOR HOUSINGS

TECHNICAL FIELD

The present invention generally relates to rear connector panels for connection to electronic cards secured in a housing and accessible from the rear thereof.

BACKGROUND ART

Housings for electronic cards are found in plural applications. For instance, distribution amplifiers, which are typically used to connect a single source to multiple outputs, usually contain a plurality of various electronic cards. Other examples of such equipment include down converters, digital conversion systems and the like.

The typical construction of a housing consists of a chassis receiving the electronic cards therein at dedicated locations. A rear face of the chassis has plural connectors to link input and output wires of various peripherals to the electronic cards. Printed circuit boards connect the plural connectors on the rear face of the chassis to the various electronic cards.

As the card contents of a frame are often subject to changes, the above-described components must be adapted therefor. For instance, housings are frequently acquired with free space therein for receiving new electronic cards. Accordingly, the plural connectors on the rear face must comply with the electronic cards that are added in the chassis. As an example, a distribution amplifier may be provided with video cards, audio cards, redundant power supply units, personal computer configuration cards, and must thus have the appropriate connectors therefor.

Another important design factor is that the electronic cards within the housing may emit electromagnetic interference (EMI) or be subject to EMI of an adjacent device. Therefore, the housing must ensure EMI integrity.

A housing configuration which has complied with the above-described factors consists of rear connector panels singly removable from the rear face of the housing. These rear connector panels each comprise an upstanding rectangular metal plate such that, when rear connector panels are installed side by side on the rear of a housing, the metal plates thereof form the rear face of the housing. Each rear connector panel is linked to one electronic card, and thus the metal plate of each rear connector panel has the proper connectors thereon for complying with the use of its respective card. More precisely, the metal plate of each rear connector panel has a first vertical edge defining a channel for receiving a gasket therein. Therefore, when in side-by-side relationship, the gasket in the first vertical edge of a first rear connector panel is against a second vertical edge of an adjacent rear connector panel, so as to ensure EMI integrity. Each rear connector panel further comprises a printed circuit board extending perpendicularly to the metal plate inside the housing so as to be connected to an electronic card.

Although the above-described configuration meets the design factors, there is the possibility to further optimize the configuration in order to reduce the size of the housings. Furthermore, the above-described configuration involves extensive manpower and many steps in its assembly. In the conception of frames, the minimizing of the dimensions thereof is limited by the rear connector panel/printed circuit board configuration described above.

SUMMARY OF INVENTION

Therefore, it is a feature of the present invention to provide rear connector panels which substantially overcome the disadvantages of the prior art.

It is a further feature of the present invention to provide a housing adapted for receiving these rear connector panels.

Therefore, in accordance with the present invention, there is provided a connector panel for a housing of the type having an opening for accommodating interchangeable electronic cards therein and having shielding from electromagnetic impulses, said connector panel comprising: a printed circuit board body with a conductive plane; a card connector on said panel adapted for being connected to an electronic card in the housing; at least one input/output connector on a first surface of said panel, said input/output connector being connected to said card connector by a printed circuit of said printed circuit board body and adapted for being connected to an input/output of a peripheral device; and said connector panel adapted for being mounted side by side and in shielding connection with similar ones of said connector panel to cover the opening of the housing so as to maintain the shielding of the housing.

According to a further embodiment of the present invention, there is provided a housing adapted for receiving electronic cards therein, said housing comprising: a chassis shielded from electromagnetic interference and having an opening in a face thereof, said chassis adapted for receiving electronic cards therein; and at least two connector panels each having a printed circuit board body with a conductive plane, a card connector adapted for being connected to at least one electronic card in the housing, at least one input/output connector on said connector panel, each said input/output connector being connected to said card connector by a printed circuit of said printed circuit board body, each said input/output connector adapted for being connected to an input/output of a peripheral device; wherein said connector panels are adapted for being mounted side by side and in shielding connection to cover the opening of the chassis so as to maintain an electromagnetic interference shielding of the housing.

According to a still further embodiment of the present invention, there is provided A chassis for a housing of the type accommodating interchangeable electronic cards therein, said chassis comprising a conductive cast shell having an electronic card support structure integrally formed therewith for supporting electronic cards therein in a predetermined position, said electronic cards being slid into said predetermined position in said shell, said shell having at least a front opening for receiving therethrough said electronic cards, said front opening being closeable by a front panel, a rear face of said chassis having connectors for interfacing peripherals with said electronic cards received in said chassis and supported by said electronic card support structure in said predetermined position, first card connectors connecting each said electronic card in said predetermined position to at least a controller, said first card connectors being positioned so as to be connected with said electronic cards in said predetermined position, said shell forming with said front panel and said rear face a housing shielded from electromagnetic interference.

BRIEF DESCRIPTION OF DRAWINGS

A preferred embodiment of the present invention will now be described with reference to the accompanying drawings in which.

DESCRIPTION OF PREFERRED EMBODIMENTS

Figures 1, 2:
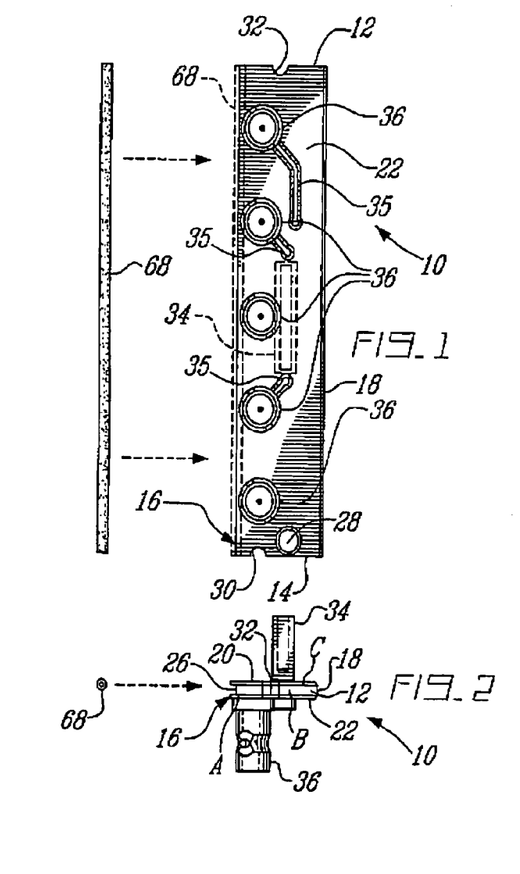
FIG. 1 is a rear elevational view of a single rear connector panel in accordance with the present invention.
FIG. 2 is a top plan view of the single rear connector panel.

Referring now to FIG. 1, a single rear connector panel in accordance with the present invention is generally shown at 10. Referring to both FIGS. 1 and 2, the single rear connector panel 10 has a front face 20 and a rear face 22. The front face 20 and the rear face 22 define therebetween a top end surface 12, a bottom end surface 14, and lateral side surfaces 16 and 18. As best seen in FIG. 2, the lateral side surface 16 has a channel 26 extending from the top end surface 12 to the bottom end surface 14, whereas the lateral side surface 18 is slightly convex.

Returning to FIG. 1, a throughbore 28 extends from the front face 20 to the rear face 22 of the single rear connector panel 10, and is positioned adjacent to the bottom end surface 14. The bottom end surface 14 has an alignment slot 30 therein. The alignment slot 30 is semicircular in shape. Similarly, the top end surface 12 comprises an alignment slot 32, which is also semicircular in shape. The alignment slot 30 is preferably offset with respect to the alignment slot 32. In other terms, if a line were to join the center of the alignment slot 30 to the center of the alignment slot 32, this line would not be parallel to the lateral side surfaces 16 and 18.

As shown in FIG. 2, the single rear connector panel 10 is a printed circuit board constructed from multi-layering methods using at least three layers of micro-panel A, B and C (i.e., glass epoxy with copper contents) with all faces, throughbores and slots typically coated with a tin copper plating. The channel 26 results from the use of the middle one B of the three micro-panel layers having a width dimension smaller than the outer micro-panel layers A and C. Other methods may be used to get the channel 26 in the single rear connector panel 10, such as various machining techniques, although it is preferable to use micro-panel layers of different widths.

Each rear connector panel 10 has a conductive plane to ensure the electromagnetic shielding thereof. According to the type of electronic card to which it will be connected, the rear connector panel 10 has a card, connector 34 on the front face 20 thereof. The rear connector panel 10 is shown having five BNC connectors 36 on the rear surface 22 thereof. As the rear connector panel 10 consists of a printed circuit board, the connectors 36 are connected to the card connector 34 via a printed conductive circuit on the board, as shown at 35. in FIG. 1. It is pointed out that the connectors may be amongst a plurality of types to serve as an interface between input/output of peripherals and the electronic cards (e.g., RJ-45, HD-15, HD-26, fiber optic input and output, etc.)

Figure 3:
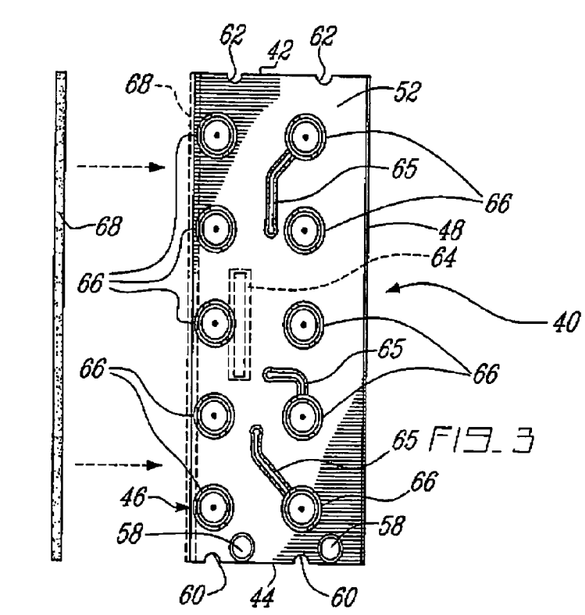
FIG. 3 is a rear elevational view of a double rear connector panel in accordance with the present invention.
Figure 4:
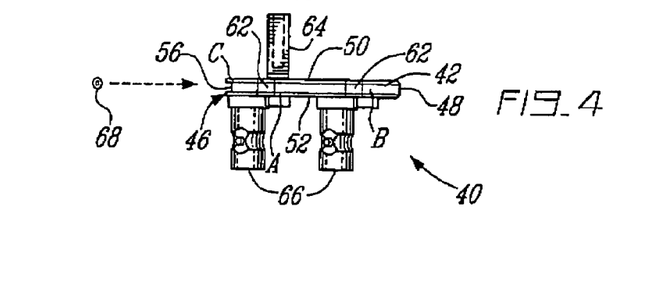
FIG. 4 is a top plan view of the double rear connector panel.

Referring now to FIGS. 3 and 4, a double rear connector panel is generally shown at 40. The double rear connector panel 40 is rectangular shaped, and is generally similar to the single rear connector panel 10, aside from being twice its width. Therefore, the double rear connector panel 40 has a front face 50 and a rear face 52, and has the same thickness as the single rear connector panel 10. Top end surface 42, bottom end surface 44 and lateral side surfaces 46 and 48 separate the front face 50 from the rear face 52 of the rear connector panel 40. The lateral side surface 46 has a channel 56 therein. The channel 56 extends from the top end surface 42 to the bottom end surface 44. A pair of throughbores 58 are positioned adjacent to the bottom end surface 44. Two alignment slots 60 are defined in the bottom end surface 44, whereas two alignment slots 62 are defined in the top end surface 42, and, similarly to the alignment slots of the rear connector panel 10, the alignment slots 62 are offset with respect to the alignment slots 60.

Referring to FIG. 4, the double rear connector panel 40 is also a printed circuit board with at least three layers of micro-panel A, B and C. The double rear connector panel 40 is constructed in a fashion similar to the single rear connector panel 10 to define the channel 56. A card connector 64 is connected on the front surface 50, and ten input or output connectors 66 are disposed on the rear surface 52 and connected to the connector 64 by printed circuitry 65 (FIG. 3) of the printed circuit board. The connectors 66 are depicted as BNC connectors, but are chosen in accordance with the type of electronic card to which the rear connector panel 40 will be connected. If the rear connector panels 10 and 40 serve to bridge an empty space of the housing (i.e., where there is no electronic card), the rear connector panels 10 and 40 will simply be without card connectors nor input/output connectors.

As shown in FIGS. 2 and 4, the channels 26 and 56 each receive a conductive gasket 68 therein. The gasket 68 herein shown is tubular and may also be solid. The gasket 68 is preferably of a resilient material. When the gasket 68 is received in the channels 26 or 56, it extends from the bottom end surface 14 or 44 to the top end surface 12 or 42, respectively. An adhesive ensures the bond of the conductive gasket 68 to the channels 26 and 56.

Figure 5:
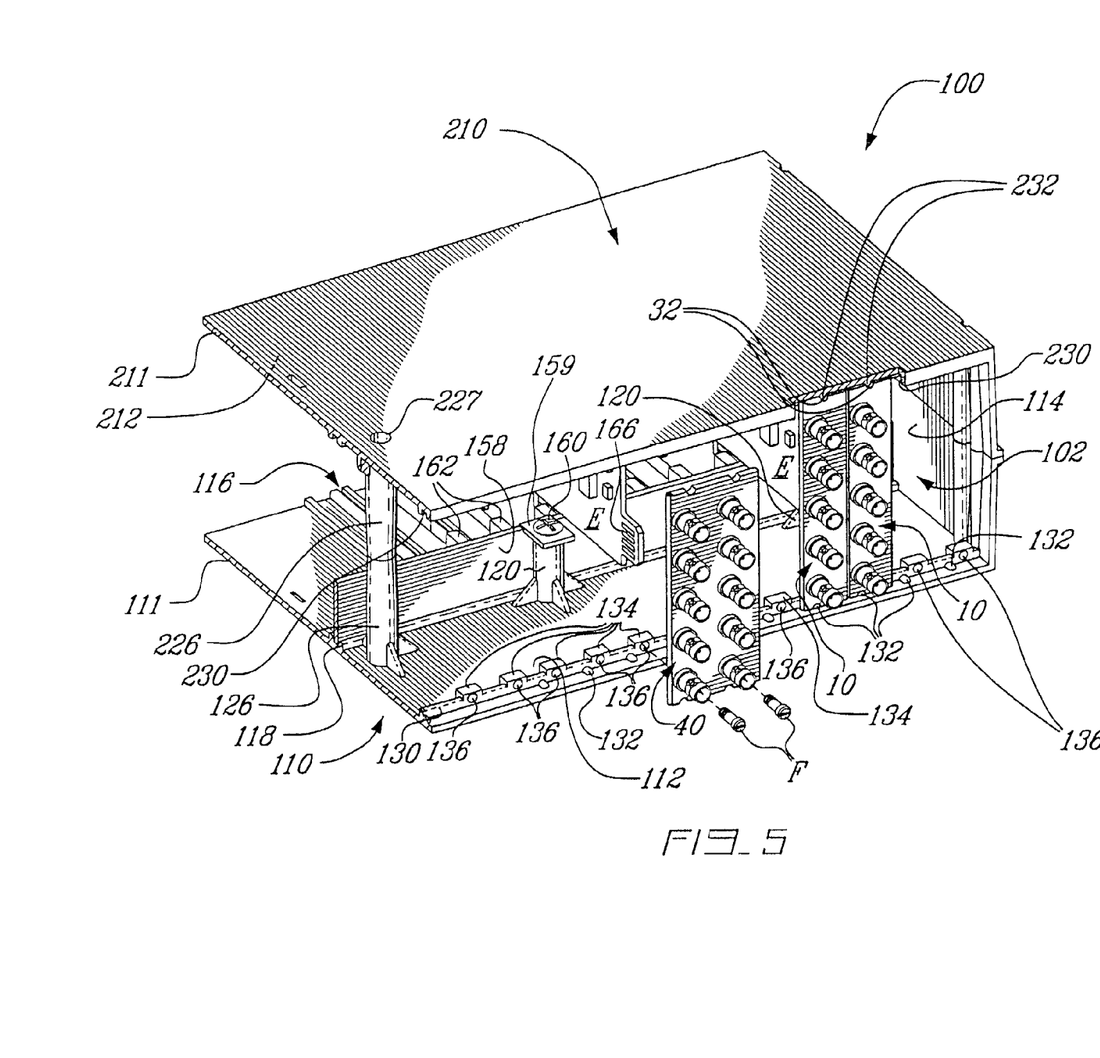
FIG. 5 is an exploded view, partly fragmented, of a double rear connector panel being mounted to a chassis of a housing.

Referring now to FIG. 5, two single rear connector panels 10 are shown mounted to a chassis 100 of a typical housing for electronic cards, and a double rear connector panel 40 is shown being mounted to the chassis 100. The chassis 100 has a rectangular opening 102 on its rear face by which rear ends of electronic cards E within the chassis are accessible. The chassis 100 also has an abutment wall 130 on a bottom surface 112 and a groove 230 on a top surface 212 thereof. Protrusions 132 extend outwardly from the abutment wall 130 on the bottom surface 112 of the chassis 100, and are equidistantly spaced. Similarly, equidistantly spaced protrusions 232 are disposed in the groove 230 and project downwardly therefrom. The protrusions 132 and 232 have a semicircular cross-section. Blocks 134 project upwardly from the abutment wall 130 of the bottom surface 112, and are also equidistantly spaced. The blocks 134 each have a bore 136 which is tapped.

The blocks 134 and the protrusions 132 are each spaced by about the equivalent of the width of a single rear connector panel. It is also pointed out that the height of the chassis 100 between its bottom surface 112 and the groove 230 is generally the same as the height of the rear connector panels 10 and 40. Therefore, when a rear connector panel 10 or 40 is connected to the chassis 100, it is positioned such that the front face 20 or 50, respectively, abuts the abutment wall 130, with an upper portion of the rear connector panels 10 or 40 received in the groove 230 of the top surface 212. The protrusions 132 and 232 of the chassis 100 are received in the alignment slots (30 and 32, or 60 and 62, accordingly) of the rear connector panels 10 or 40, such that the position of the rear connector panels 10 and 40 on the chassis 100 is determined, whereby the card connectors 34 or 64 (FIGS. 2 and 4) will connect to corresponding electronic cards E. The electronic cards E are generally perpendicular to the front faces of the connector panels 10 or 40 and thus allow the card connectors 34 or 64 to snap into a portion 166 of the electronic card E. Furthermore, the throughbores 28 and 58 of the connector panels 10 and 40, respectively, are positioned opposite the tapped bore 136 of the blocks 134, such that the rear connector panels 10 or 40 are easily fastened to the chassis 100, using bolts F, for instance.

Still referring to FIG. 5, the single rear connector panels 10 shown mounted to the chassis 100 have the protrusions 132 and 232 received in the alignment slots 30 and 32, respectively. The elongated rectangular shape of the rear connector panels 10 and 40 facilitates the side-by-side relation between rear connector panels so as to fully cover the rectangular opening 102 of the chassis 100, and thus enclose the electronic cards E in the housing in a Faraday cage, as will be described below. Obviously, other configurations and shapes for the rear connector panels are possible, yet elongated rectangular connector panels provide an optimal solution from installation, manufacturing and electromagnetic shielding standpoints.

When rear connector panels are adjacent to each other, whether it be single adjacent to double or single to single, etc., the channel (26 or 56) of the lateral side (16 or 46) of one rear connector panel is face to face with the convex surface of the lateral side surface (18 or 48) of the adjacent rear connector panel, as shown in FIG. 5 for the side-by-side single rear connector panels 10. The distance between adjacent rear connector panels is such that the gasket 68 is squeezed therebetween. The gasket 68 is conductive, thereby ensuring the EMI shielding between adjacent rear connector panels. The lateral side surfaces which are slightly convex are so shaped in order to ease the installation of adjacent rear connector panels. Sharp edges to the lateral side surface 18 and 48 would rip the gasket 68 out of the channels 26 and 56. As the gaskets 68 are preferably resilient, they will adapt to the space between adjacent rear connector panels by getting squeezed therebetween. The configuration of the rear connector panels 10 and 40 enables the insertion of one such rear connector panels between other ones of the rear connector panels already mounted to the chassis 100. The rear connector panel is simply entered into the groove 230 by its upper end, with the protrusion 232 being received in the alignment slot 32 in the case of a single rear connector panel 10, or 62 in the case of a double rear connector panel 40. The rear connector panel is then pivoted so as to abut against the abutment wall 130, at which point the protrusion 132 is received in the alignment slot 30 or 60, and the rear connector panel fills the gap between other rear connector panels. In doing so, the card connector 34 or 64 will connect to the electronic card E. Thereafter, the rear connector panel is fastened to the chassis 100 using a bolt F. Therefore, the insertion of the rear connector panel 10 or 40 between other rear connector panels 10 or 40 creates a shielding relation between the rear connector panels, and connects the rear connector panel to an electronic card.

The rear connector panels 10 and 40 serve many functions in the housing. They have a structural function as they make up a portion of the rear face of the housing. They also hold the input or output connectors by which the electronic card may be wired to peripherals. The rear connector panels also have a shielding function as they are shielded from electromagnetic interference by each having a conductive plane, thereby maintaining shielding of the housing when mounted thereto. The conductive gaskets 68 shield the gaps between each pair of adjacent rear connector panels.

Furthermore, the rear connector panels are the link between the input/output connectors and the electronic cards. As the rear connector panels are made of a printed circuit board, they have the required circuitry thereon to process the signals to and from the electronic cards. Therefore, the fact that the rear connector panels are printed circuit boards causes a simplifying of the configuration of the housing frames as the rear connector panels of the present invention combine the features of the metal plate/printed circuit board configuration making up the rear connector panels of the prior art. The quantity of material within the frame is minimized and the dimensions of the chassis are substantially decreased. The rear connector panels are also always easy to remove from or to secure to the chassis 100, as few fasteners (e.g., one or two bolts are required for the fastening) connect the rear connector panels to the frame. Therefore, the rear connector panels ensure easy interchangeability of the rear connector panels, and thus of the electronic cards.

Finally, as the printed circuit boards typically require cooling or ventilating, the configuration of the rear connector panels allows to decrease the cooling and ventilating as the rear connector panels have a portion thereof facing outwardly from the housing, thereby privileging cooling by convection and radiation.

Although the rear connector panels have been described as being securable to housings, it is obvious that they may be used in plural other applications. The channels 26 and 56 defined by the middle layers of printed circuit board layers may be extended to cover the totality of the lateral surfaces of the connector panels, such that the connector panels may be used individually and establish an electromagnetic interference shielded connection with what they are connected to.

Figure 6:
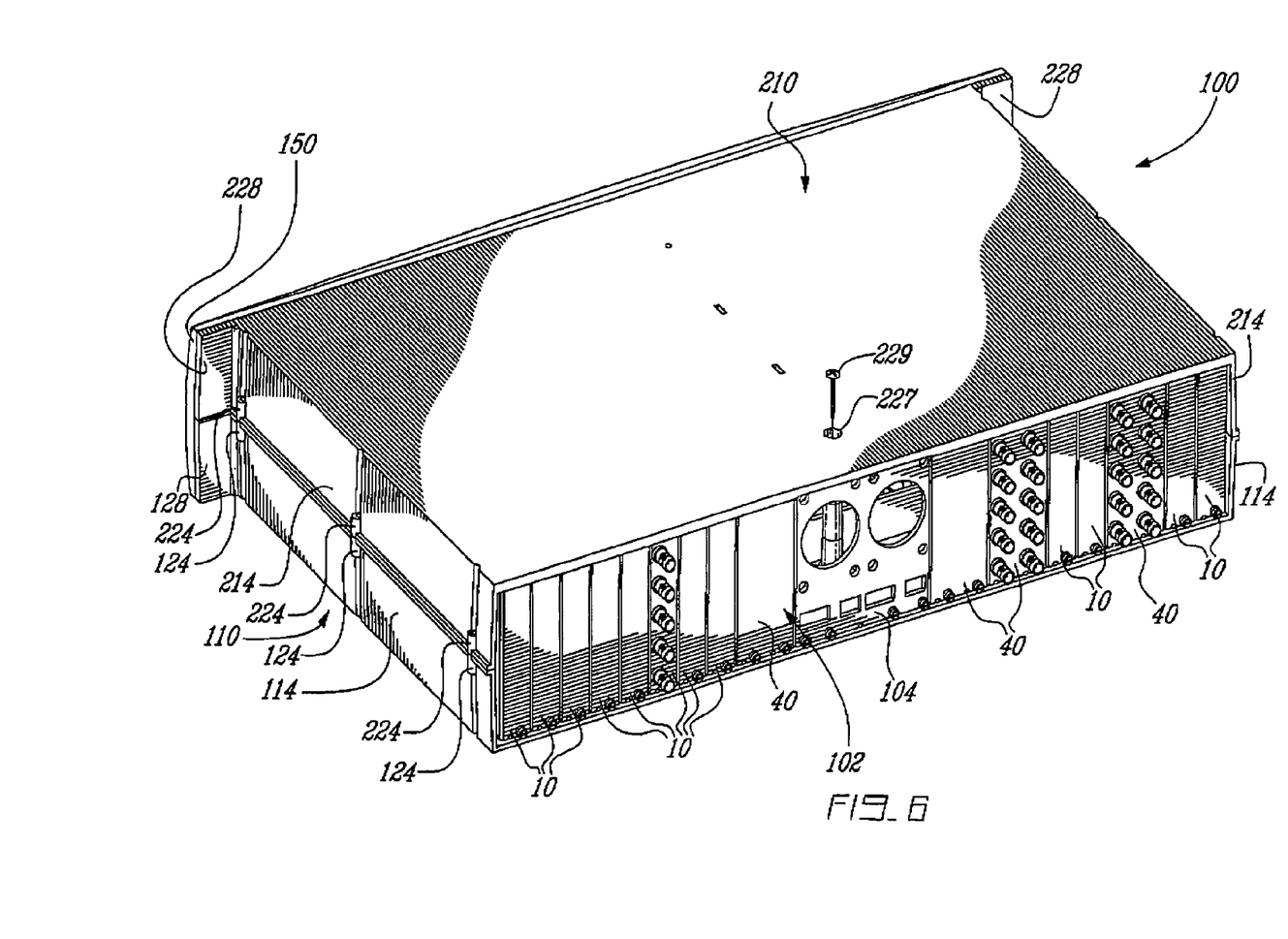
FIG. 6 is a perspective view of a rear end of the chassis with rear connector panels mounted thereon.

Referring to FIG. 6, the chassis 100 is shown with the rear opening 102 thereof completely covered with single rear connector panels 10 and double rear connector panels 40. A cover plate 104 for a power block and ventilators is shown generally at the middle of the rectangular opening 102, and is in shielded relationship with the rear connector panels adjacent thereto. Three of the rear connector panels illustrated in FIG. 6 have connectors thereon. Therefore, they are connected to an electronic card in the chassis 100. The other rear connector panels are blank. When a specific electronic card is purchased to be used in the chassis 100, a rear connector panel is to be supplied with the electronic card in order to have the connectors thereon corresponding with the type of electronic card and its application. Therefore, the chassis 100 adapts to the changing needs of the user thereof. The blank rear connector panels are simply removed to be replaced with the ones having the right connectors. The insertion of the cards in the chassis 100 will be described in detail hereinafter.

Figure 7:
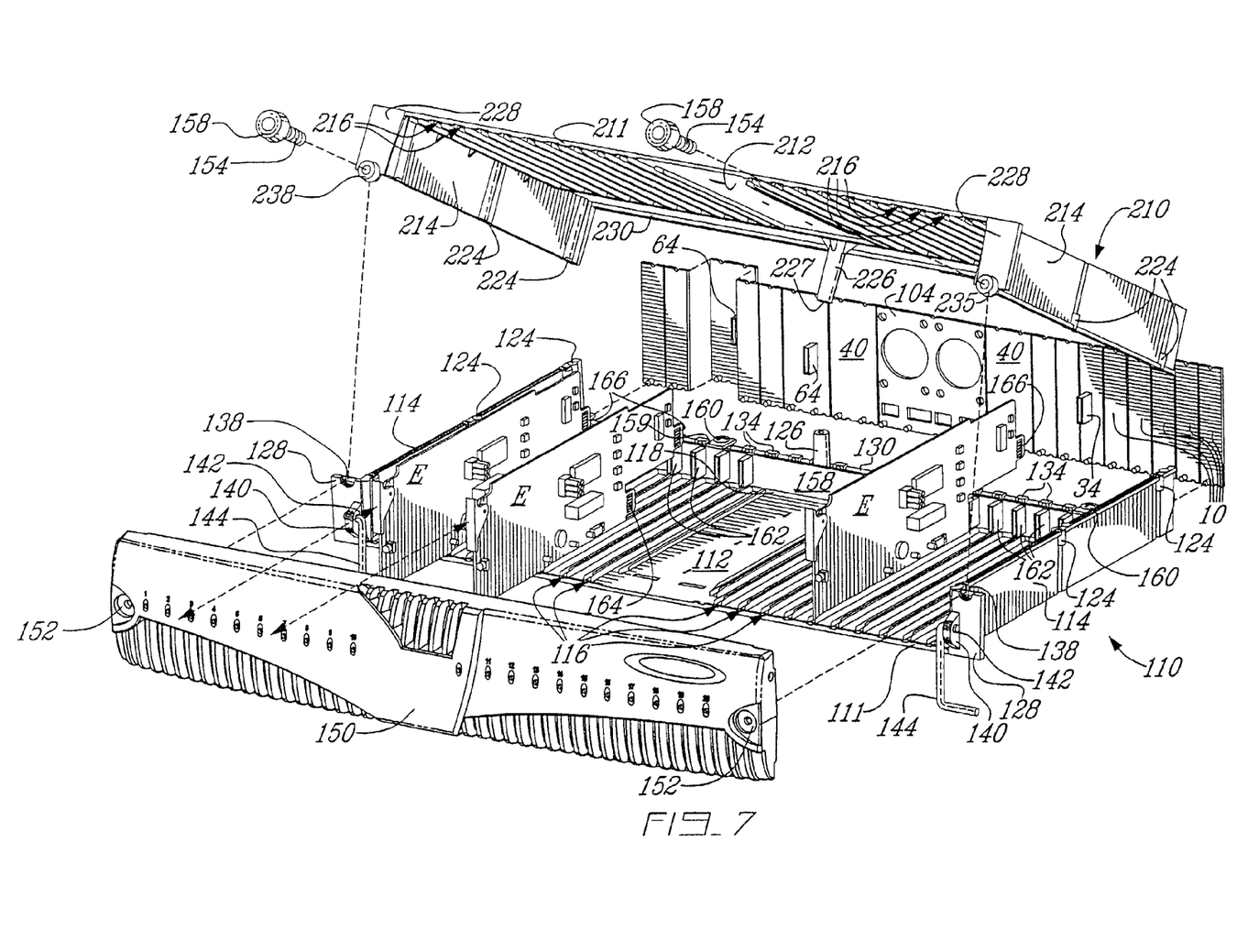
FIG. 7 is an exploded view of the housing in accordance with the present invention.

Referring now the FIG. 7, the chassis 100 is shown being composed of a bottom shell 110 and an upper shell 210. The bottom shell 110 and the upper shell 210 may be manufactured according to various methods, but are preferably cast, using for instance a die-casting process. Such chassis are typically made of plied metal sheets with structures fastened thereon through processes like welding, gluing, or with various mechanical fasteners such as bolts and screws.

Having the bottom shell 110 and the upper shell 210 die-cast in a metal such as magnesium greatly minimizes the amount of time and manpower required to assemble these shells to form the chassis 100.

The bottom shell 110 has a bottom wall 111 defining the bottom surface 112. Lateral walls 114 extend upwardly from the bottom surface 112. Pairs of parallel guides form channels 116, which extend from a front end of the bottom shell 110 towards a rear end thereof. The guides are spaced such that the channels 116 that they define are adapted for receiving the electronic cards E in sliding engagement therein. A groove 118 is positioned perpendicular to rear ends of the channels 116 and extends between lateral walls 114.

As best seen in FIG. 5 and explained hereinbefore, the rear end of the bottom shell 110 has the abutment wall 130 with the protrusions 132 and the blocks 134. Attachment posts 120, two of which are shown in FIG. 5, project upwardly from the bottom surface 112, in the space between the groove 118 and the abutment wall 130. The attachment posts 120 each have a central bore 122, which is tapped for receiving a bolt 160 therein. Accordingly, they will enable a master connector board 158 to be received in the groove 118, as seen in FIG. 7. The master connector board 158 will be held vertical by having support brackets 159 thereof anchored to the attachment posts 120 through the bolts 160. The master connector board 158 is provided with card connectors 162. The card connectors 162 are positioned so as to be aligned with the channels 116. The electronic cards E are configured such that, when they are slid into the channels 116, they have a portion 164 thereof snapping into connection with the master connector board 158. The master connector board 158 is therefore used for connecting the electronic cards E to the motherboard and the power supply, both of which are not shown but are to be typically positioned in the middle of the chassis 100, in front of the cover plate 104.

Cylindrical nuts 124 are positioned adjacent to an upper edge of the lateral walls 114, to the outside of the bottom shell 112, and are tapped. A structure post 126 is aligned with the attachment posts 120 and also extends upwardly from the bottom surface 112 of the bottom shell 110. The structure post 126 is tapped, for reasons which will be described in detail hereinafter.

A pair of bottom flaps 128 project perpendicularly from the lateral walls 114 at a front end of the bottom shell 110, and both have a semi-circular slot 138 in an upper edge thereof. Pivot blocks 140 project forwardly from the bottom flaps 128. The pivot blocks 140 each have a pivot bore 142 for receiving a pivot arm 144 therein, by which a front panel 150 will be connected to the bottom shell 110. This will be explained in detail hereinafter.

Still referring to FIG. 7, the upper shell 210 is shown with its upper wall 211 defining the top surface 212 which was described hereinbefore. A pair of lateral walls 214 project downwardly from the top surface 212. Parallel guides define channels 216, which are also sized for receiving the electronic cards E therein. When the upper shell 210 is mounted to the bottom shell 110, the channels 216 are each directly above a corresponding one of the channels 116 such that the electronic cards E are slid into engagement with the card connectors 162 of the master connector board 158. Therefore, the electronic card received in the chassis 100 will be received perpendicular to the bottom surface 112 and the top surface 212 of the chassis 100 by being guided by these pairs of channels 116 and 216. The electronic cards E thus held by the channels 116 and 216 and connected to the master connector board 158 will have a second portion 166, as seen in FIG. 5, for being connected to card connectors 34 and 64 of rear connector panels 10 and 40, respectively. Therefore, once an electronic card E is inserted into the chassis 100, its corresponding rear connector panel is thereafter mounted to the chassis 100 to be connected to the second portion 166 thereof.

A structure post 226 projects downwardly from the top surface 212, and is positioned to be co-linear with the structure post 126 of the bottom shell 110 when the upper shell 210 and the bottom shell 110 are mounted one to another. A throughbore 227 extends throughout the structure post 226 and finishes in a counterbore in the upper wall 211 of the upper shell 210. Therefore, the upper shell 210 may be fixed to the bottom shell 110 by inserting a bolt 229 which will be accommodated in the throughbore 227 and will engage a threading relation with the tapped bore of the structure post 126. Furthermore, cylindrical tubes 224 are positioned on a bottom edge of the lateral walls 214 of the upper shell 210, so as to be opposite cylindrical nuts 124 of the bottom shell 110 when the bottom shell 110 is mounted to the upper shell 210. Fasteners such as bolts (not shown) are used to secure the upper shell 210 to the bottom shell 110. It is pointed out that the lateral walls 114 and 214 have flanged surfaces in order to increase the contact surface between the bottom shell 110 and the upper shell 210.

Upper flaps 228 project outwardly from the lateral walls 214. Cylindrical nuts 238 overlap a bottom edge of the upper flaps 228, so as to be received in the semi-circular slots 138 of the bottom flaps 128 of the bottom shell 110 when the latter is assembled with the upper shell 210.

Figure 8:
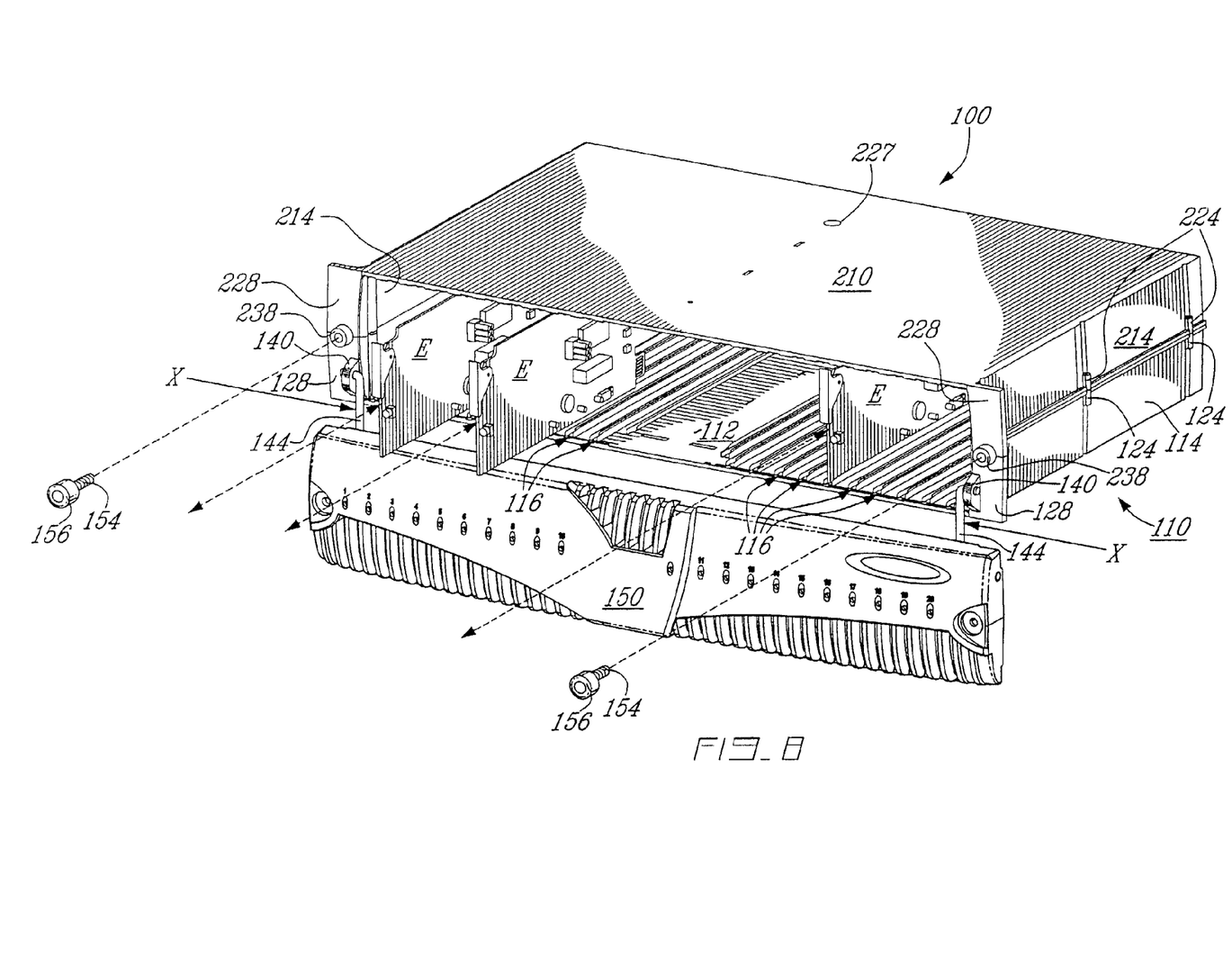
FIG. 8 is a perspective view of the housing having the front panel pivoted away therefrom.
Figure 9:
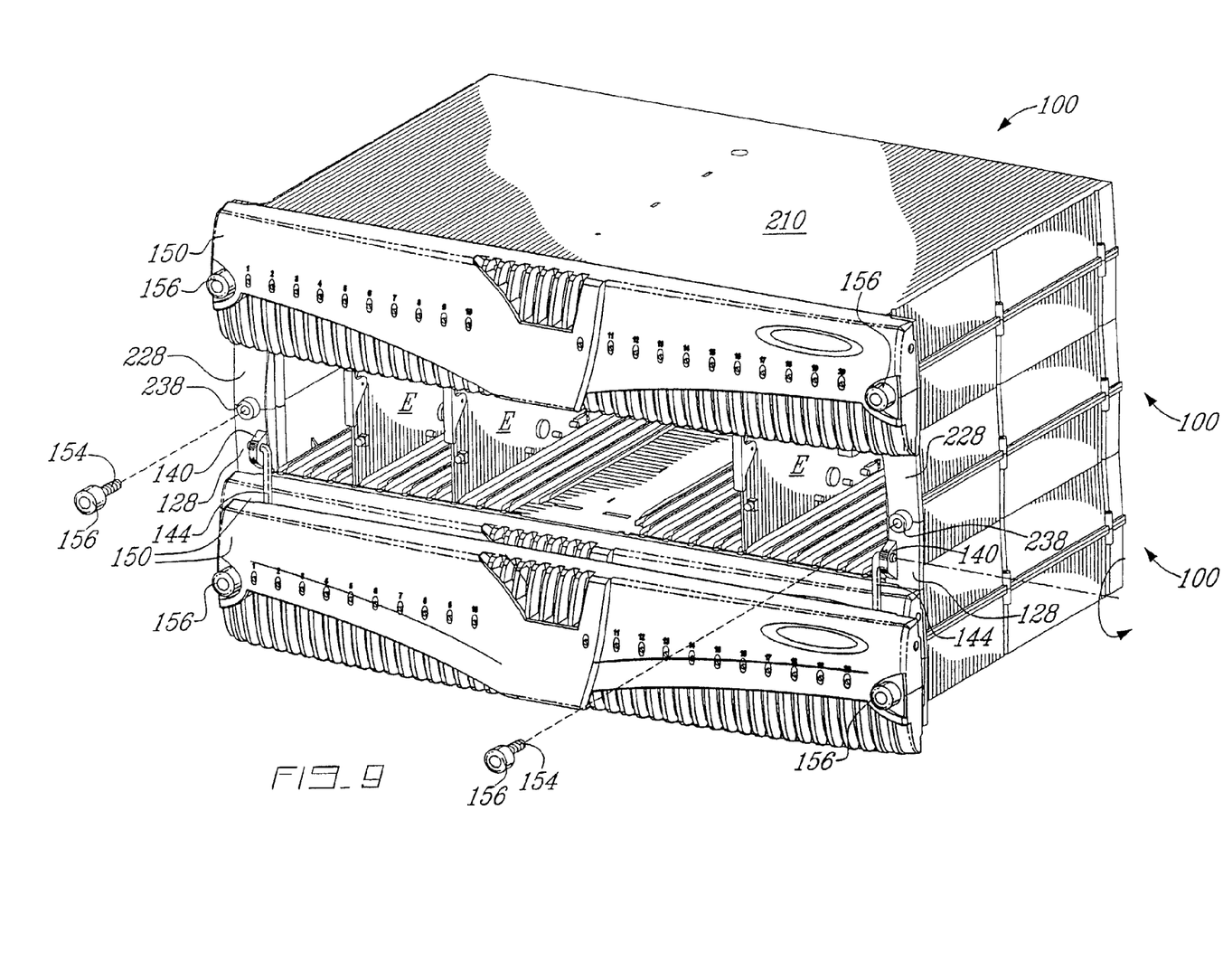
FIG. 9 is a stack of housings in accordance with the present invention.

Referring to FIGS. 7 and 8, the front panel 150 has holes 152 which will be in register with the cylindrical nuts 238 when the front panel 150 is on the chassis 100, such that the front panel 150 may be secured to the chassis 100 with bolts 154. The bolts 154 each have a large head 156 so as to be manually screwed or unscrewed from the cylindrical nuts 238. The front panel 150 is pivotally and permanently mounted to free ends of the pivot arms 144. The pivot arms 144 are constructed with a resilient material. By applying an inward pressure on the pivot arms 144, as shown by arrows X, the ends of the pivot arms 144 received in the pivot bores 142 of the pivot blocks 140 can be retracted therefrom, whereby the front panel 150 is removable from the chassis 100. Otherwise, as illustrated in FIG. 9, the front panel 150 may be pivoted away from the chassis 100 so as to insert the electronic cards E into the chassis 100. The front panel 150 is thus displaceable between an operative position, wherein it is abutted against the bottom flaps 128 and the upper flaps 228 so as to shut the front opening of the chassis 100, and an insertion position, wherein it is pivoted away from the chassis 100, as illustrated in FIG. 8, for allowing electronic cards to be inserted into the chassis 100. FIG. 9 illustrates three housings, the uppermost and the bottommost ones having their front panels 150 in the operative position, whereas the middle one has the front panel 150 pivoted away to the insertion position, for the electronic cards to be inserted therein.

The configuration of the chassis 100, including the use of the shielded rear connector panels and the connecting configuration between the electronic cards, the rear connector panels and the master connector board, enables an optimization in the space of the chassis 100. Accordingly, the chassis 100 may produce five BNC connectors in height while remaining under the EIA Regulation RS-310-C. The front panel 150 has a conductive plane, as the chassis 100 and the rear connector panels and cover plate 104 do, such that the housing forms a Faraday cage.

It is within the ambit of the present invention to cover any obvious modifications of the embodiments described herein, provided such modifications fall within the scope of the appended claims.

The invention claimed is:

1. A connector panel for a housing having an opening for accommodating interchangeable electronic cards therein and having shielding from electromagnetic impulses, said connector panel comprising:
   a printed circuit board body with a conductive plane, the printed circuit board body having at least three micro-panel layers, with a longitudinal channel being defined in a first lateral surface of the connector panel by a middle one of said three micro-panel layers being set back from outer ones of said three micro-panel layers;
   a card connector on said panel adapted for being releasably connected to an electronic card in the housing;
   at least one input/output connector on a first surface of said panel, said input/output connector being connected to said card connector by a printed circuit of said printed circuit board body and adapted for being connected to an input/output of a peripheral device; and
   a conductive gasket received in the longitudinal channel for forming a shielding connection between the connector panel and a similar one of said connector panel mounted side by side to cover the opening of the housing, so as to maintain the shielding of the housing.

2. The connector panel according to claim 1, wherein a second lateral surface of said connector panel is convex so as to facilitate a positioning of a similar one of said connector panel in side-by-side relationship between the first lateral surface of one of the connector panel and a second lateral surface of another of the connector panel.

3. The connector panel according to claim 2, wherein the printed circuit board body has an elongated rectangular shape.

4. The connector panel according to claim 1, wherein said conductive gasket is resilient.

5. The connector panel according to claim 1, wherein the printed circuit board body has a first surface and a second surface, the card connector being on said first surface and the input/output connector being on said second surface.

6. The connector panel according to claim 1, wherein said connector panel has at least one alignment slot therein for being aligned when mounted to cover the opening of the housing so as to ensure an electromagnetic shielding connection between adjacent ones of said connector panel.

7. The connector panel according to claim 6, wherein said connector panel as a throughbore for being fastened to the housing.

8. The connector panel according to claim 1, wherein the connector panel has five vertically aligned BNC-connectors for a housing of EIA Regulation RS-310-C standards.

9. A housing adapted for receiving electronic cards therein, said housing comprising:
   at least two connector panels each having a printed circuit board body with a conductive plane, a card connector adapted for being releasably connected to at least one electronic card in the housing, at least one input/output connector on said connector panel, each said input/output connector being connected to said card connector by a printed circuit of said printed circuit board body, each said input/output connector adapted for being connected to an input/output of a peripheral device; and
   a chassis shielded from electromagnetic interference and having an opening in a face thereof, said chassis adapted for receiving electronic cards therein, the chassis having a groove for receiving therein an edge portion of said connector panels, such that a connector panel being mounted to the chassis is introduced in said groove and pivoted into connection with a corresponding electronic card;
   wherein said connector panels are adapted for being mounted side by side and in shielding connection to cover the opening of the chassis so as to maintain an electromagnetic interference shielding of the housing.

10. The housing according to claim 9, wherein each said connector panel has a first lateral surface and a second lateral surface, said first lateral surface having a longitudinal channel adapted for receiving therein a conductive gasket, so as to establish an electromagnetic shielding connection between said first lateral surface of a first of said connector panels and an adjacent second lateral surface of a second of said connector panels.

11. The housing according to claim 10, wherein said second lateral surface of each said connector panel is convex so as to facilitate a positioning of an adjacent one of said connector panels in side-by-side relationship therewith.

12. The housing according to claim 11, wherein the printed circuit board body of each said connector panel has an elongated rectangular shape.

13. The housing according to claim 10, wherein said conductive gasket is resilient.

14. The housing according to claim 9, wherein the printed circuit board body of each said connector panel consists of at least three micro-panel layers.

15. The housing according to claim 14, wherein the longitudinal channel of each said connector panel is defined by a middle one of said three micro-panel layers being set back from outer ones of said three micro-panel layers.

16. The housing according to claim 9, wherein the printed circuit board body has a first surface and a second surface, the card connector being on said first surface and the input/output connector being on said second surface.

17. The housing according to claim 16, wherein electronic cards received in the chassis are positioned so as to be generally perpendicular to said first surfaces of said connector panels, such that said card connectors of said connector panels connect to the electronic cards when said connector panels are mounted to the chassis.

18. The housing according to claim 9, wherein the chassis is a conductive cast shell.

19. The housing according to claim 9, wherein each said connector panel has at least one alignment slot therein for engagement with a corresponding protrusion in the chassis, for aligning said connector panels when mounted to cover the opening of the chassis so as to ensure an electromagnetic shielding connection between adjacent ones of said connector panel.

20. The housing according to claim 19, wherein said connector panels each have at least one alignment slot on an upper edge thereof and at least one alignment slot on a lower edge thereof, for engagement with corresponding protrusions on upper and lower inner surfaces of the chassis.

21. The housing according to claim 20, wherein each said connector panel has a throughbore for being fastened to a tapped hole in the chassis registered with said throughbore.

22. The housing according to claim 9, wherein said groove receives an upper edge portion of said connector panels introduced therein.

23. The housing according to claim 9, wherein said groove has protrusions therein and each said connector panel has at least one alignment slot on an upper edge thereof for engagement with a corresponding protrusion in said groove of the chassis, for aligning said connector panels when mounted to cover the opening of the chassis so as to ensure an electromagnetic shielding connection between adjacent ones of said connector panel.

24. The housing according to claim 23, wherein said connector panels further comprise at least one alignment slot on an lower edge thereof, for engagement with corresponding protrusions on a lower inner surface of the chassis.

25. The housing according to claim 24, wherein each said connector panel has a throughbore for being fastened to a tapped hole in the chassis registered with said throughbore.

26. The housing according to claim 25, wherein the chassis is a conductive cast shell with said groove and said protrusions being integrally formed in the chassis.

27. The housing according to claim 9, wherein the connector panel has five vertically aligned BNC-connectors for a housing of EIA Regulation RS-310-C standards.

* * * * *